US012332287B2

(12) United States Patent
Abouzied

(10) Patent No.: US 12,332,287 B2
(45) Date of Patent: Jun. 17, 2025

(54) RADIO-FREQUENCY POWER DETECTOR WITH TRANSIMPEDANCE AMPLIFIER AND INPUT OFFSET MITIGATION

(71) Applicant: Apple Inc., Cupertino, CA (US)

(72) Inventor: Mohamed Abouzied, La Jolla, CA (US)

(73) Assignee: Apple Inc., Cupertino, CA (US)

( * ) Notice: Subject to any disclaimer, the term of this patent is extended or adjusted under 35 U.S.C. 154(b) by 213 days.

(21) Appl. No.: 18/333,300

(22) Filed: Jun. 12, 2023

(65) Prior Publication Data

US 2024/0410922 A1    Dec. 12, 2024

(51) Int. Cl.
*G01R 21/133* (2006.01)
*G01R 21/01* (2006.01)

(52) U.S. Cl.
CPC .......... *G01R 21/133* (2013.01); *G01R 21/01* (2013.01)

(58) Field of Classification Search
CPC .. G01R 31/2623; G01R 31/261; G01R 21/06; G01R 19/30; G01R 19/00; G01R 15/144; G01R 15/12
See application file for complete search history.

(56) References Cited

U.S. PATENT DOCUMENTS

| | | | |
|---|---|---|---|
| 8,331,487 B2 | 12/2012 | Yu et al. | |
| 8,774,874 B2 | 7/2014 | Gudem et al. | |
| 9,048,921 B2 | 6/2015 | Lu et al. | |
| 9,385,666 B2 | 7/2016 | Tam et al. | |
| 10,153,934 B1 | 12/2018 | Gathman et al. | |
| 10,250,284 B2 | 4/2019 | Shih | |
| 10,885,417 B1 | 1/2021 | Stanford et al. | |
| 2005/0227646 A1* | 10/2005 | Yamazaki | H03G 3/3042 455/127.3 |
| 2009/0237068 A1* | 9/2009 | Vora | G01R 21/10 327/349 |
| 2022/0018882 A1 | 1/2022 | Bellaouar et al. | |

FOREIGN PATENT DOCUMENTS

WO    2015131391 A1    9/2015

* cited by examiner

*Primary Examiner* — Tung X Nguyen
(74) *Attorney, Agent, or Firm* — Treyz Law Group; Jason Tsai

(57) ABSTRACT

Wireless circuitry is provided that includes a radio-frequency amplifier or mixer, a power detector coupled to an input or an output of the radio-frequency amplifier or mixer, and a transimpedance amplifier coupled to an output of the power detector. The transimpedance amplifier can be implemented as a class A amplifier, a class AB amplifier, or an enhanced class AB amplifier. The power detector can include an input transistor having a gate terminal configured to receive a radio-frequency signal, a bias transistor, and a voltage generator configured to apply a calibration voltage to a gate terminal of the bias transistor to mitigate a direct current (DC) offset associated with the power detector.

20 Claims, 9 Drawing Sheets

RADIO-FREQUENCY POWER DETECTOR WITH TRANSIMPEDANCE AMPLIFIER AND INPUT OFFSET MITIGATION

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna can be fed through a power amplifier, which is configured to amplify low power analog signals to higher power signals more suitable for transmission through the air over long distances. Radio-frequency signals received at an antenna can be fed through a low noise amplifier, which is configured to amplify low power analog signals to higher power signals for ease of processing at a receiver.

The power level of radio-frequency signals being amplified by such power amplifiers or low noise amplifiers can be measured using power detectors. It can be challenging to design satisfactory power detectors for wireless communications circuitry.

SUMMARY

An electronic device may include wireless communications circuitry. The wireless communications circuitry may include one or more processors or signal processing blocks for generating baseband signals, a transceiver for upconverting (modulating) the baseband signals to radio frequencies and for downconverting (demodulating) radio-frequency signals to baseband signals, a radio-frequency power amplifier for amplifying radio-frequency signals prior to transmission at one or more antennas, and a radio-frequency low noise amplifier for amplifying radio-frequency signals received at one or more antennas in the electronic device.

An aspect of the disclosure provides wireless circuitry that includes a radio-frequency amplifier, a mixer coupled to the radio-frequency amplifier, a power detection circuit coupled to the radio-frequency amplifier or the mixer, and a differential amplifier coupled to an output of the power detection circuit. The differential amplifier can include a first transistor having a first source-drain terminal coupled to a first power supply line, a gate terminal configured to receive a first input voltage from the output of the power detection circuit, and a second source-drain terminal coupled to a first output port of the differential amplifier, and a second transistor having a first source-drain terminal coupled to the first power supply line, a gate terminal configured to receive a second input voltage from the output of the power detection circuit, and a second source-drain terminal coupled to a second output port, different than the first output port, of the differential amplifier.

An aspect of the disclosure provides power detection circuitry that includes: an input transistor having a gate terminal configured to receive an alternating current (AC) signal, a first source-drain terminal coupled to a first power supply line, and a second source-drain terminal coupled to a first output port of the power detection circuitry; a replica bias transistor having a first source-drain terminal coupled to the first power supply line and having a second source-drain terminal coupled to a second output port of the power detection circuitry; and a digital-to-analog converter configured to output a calibration voltage to a gate terminal of the replica bias transistor. The power detection circuitry can further include a bias circuit coupled to the gate terminal of the input transistor and configured to output a corresponding bias voltage to the digital-to-analog converter. The digital-to-analog converter can include a plurality of resistors connected in a chain between a first node and a second node and a plurality of switches selectively coupled to respective locations along the chain, where a selected one of the plurality of switches is activated to provide the calibration voltage to the gate terminal of the replica bias transistor.

An aspect of the disclosure provides power detection circuitry that includes a first squaring circuit configured to receive an alternating current (AC) signal, a second squaring circuit coupled to the first squaring circuit, and a voltage generator configured to mitigate a direct current (DC) offset of the power detection circuitry by outputting a calibration voltage to the second squaring circuit. The first squaring circuit can include an input transistor having a gate terminal configured to receive the AC signal, a first source-drain terminal coupled to a power supply line, and a second source-drain terminal coupled to a first output port of the power detection circuitry. The bias transistor can have a first source-drain terminal coupled to the power supply line, a second source-drain terminal coupled to a second output port of the power detection circuitry, and a gate terminal configured to receive the calibration voltage from the voltage generator. The voltage generator can include a digital-to-analog converter having a string of resistors and a plurality of switches coupled to the string of resistors, where at least a portion of the plurality of switches are selectively activated to adjust the calibration voltage.

DETAILED DESCRIPTION

Figure 1:
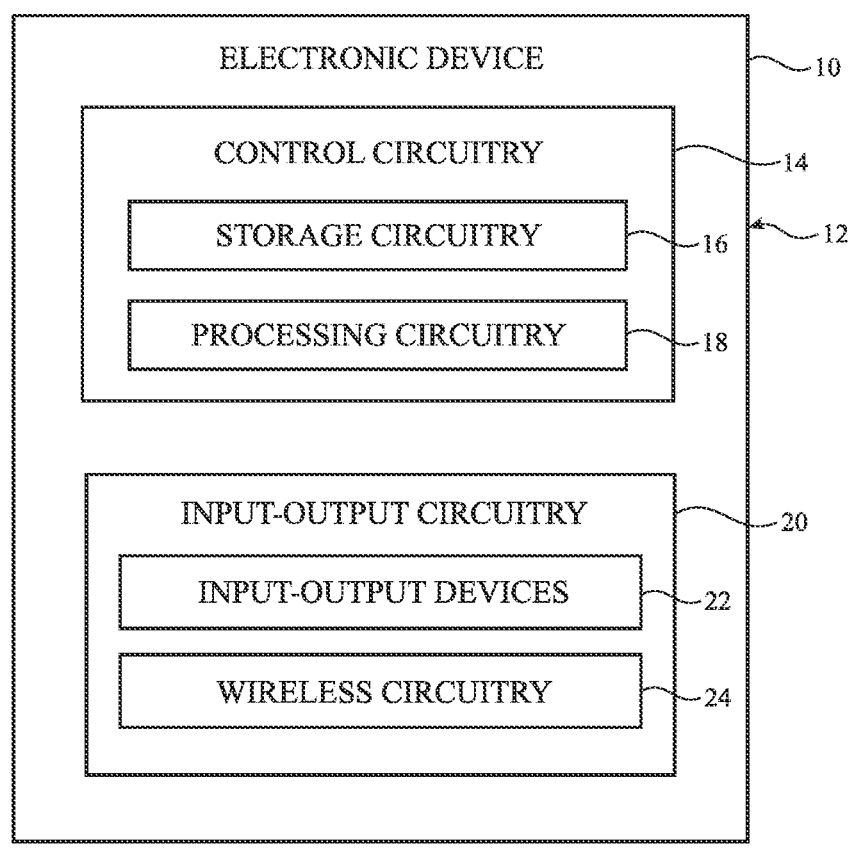
FIG. 1 is a diagram of an illustrative electronic device having wireless circuitry in accordance with some embodiments.

An electronic device such as electronic device 10 of FIG. 1 may be provided with wireless circuitry. Wireless circuitry can include radio-frequency (RF) amplifiers such as power amplifiers and low noise amplifiers. Power amplifiers ("PAs") can be used to amplify radio-frequency signals in a transmit path and are sometimes referred to as RF transmitting amplifiers, whereas low noise amplifiers ("LNAs") can be used to amplify radio-frequency signals in a receive path and are sometimes referred to as RF receiving amplifiers. Power detection circuits can be coupled at the output of these radio-frequency amplifiers, at inputs or outputs of mixer circuitry, and/or at other points along the radio-frequency transmit/receive path. A power detection circuit can receive a radio-frequency signal and can optionally output a corresponding power detection voltage to an analog-to-digital converter (ADC) via an anti-aliasing filter.

In accordance with some embodiments, a transimpedance amplifier (TIA) can be coupled at the output of a power detection circuit. The transimpedance amplifier is therefore sometimes referred to as a power detector output stage. The transimpedance amplifier can be an enhanced class AB current-mode differential amplifier, a class A differential amplifier, or a class AB differential amplifier. Use of a TIA output stage for a power detector can be technically advantageous and beneficial by ensuring a more linear power detector response, which can help minimize the error in the power detection estimation.

In accordance with some embodiments that is not mutually exclusive with the TIA output stage, the power detection circuit can include a main current branch having an input transistor and a replica bias branch having a bias transistor. A calibration generator can provide a calibration voltage to correct a DC (direct current) offset between the two branches (e.g., to correct any sizing and/or threshold voltage mismatch between the input transistor and the bias transistor). Use of such calibration generator at the input of the power detector can be technically advantageous and beneficial by minimizing the error in the power detection estimation across different operating temperatures.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts of all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHZ WLAN band (e.g., from 2400 to 2480 MHz), a 5 GHz WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network (WPAN) frequency bands such as the 2.4 GHz Bluetooth® band or other WPAN communications bands, cellular telephone frequency bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHZ), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802. XX family of standards, and/or any other desired frequency bands of interest.

Figure 2:
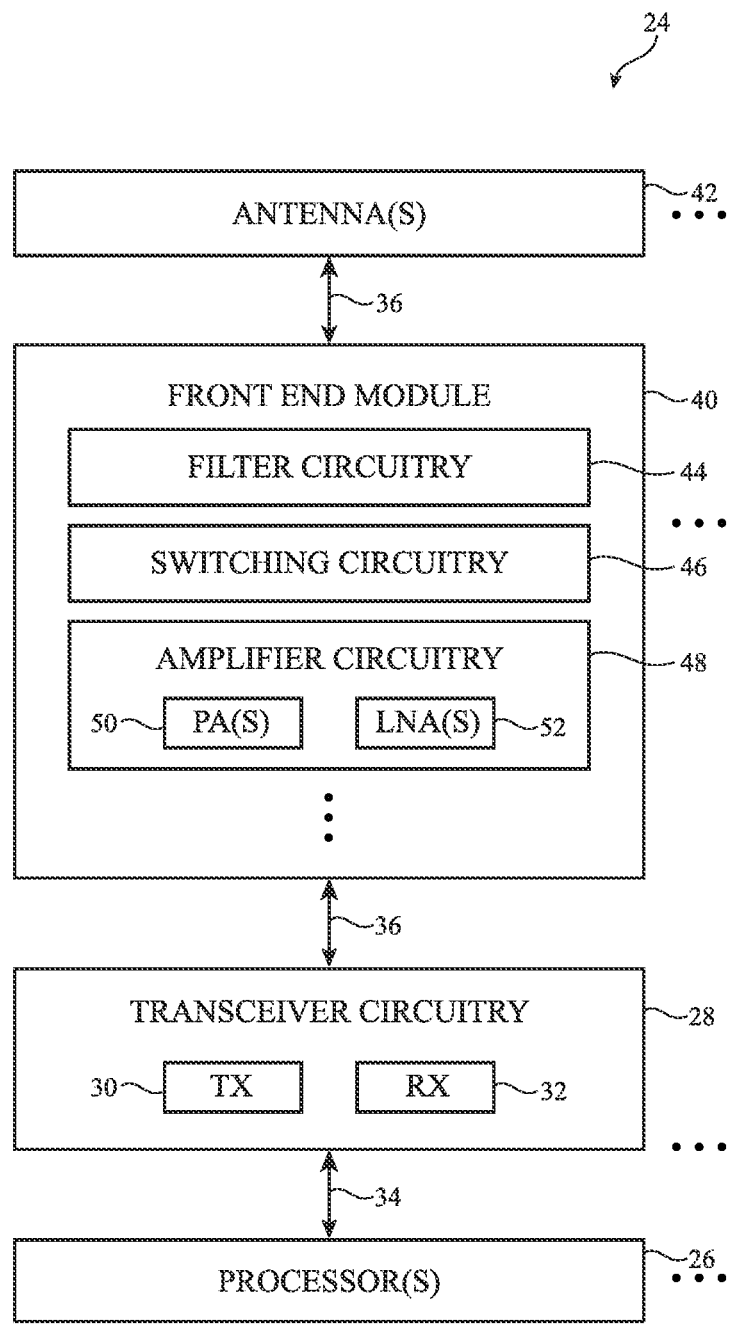
FIG. 2 is a diagram of illustrative wireless circuitry having radio-frequency amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 configured to generate a current that at least partially cancels a non-linear current associated with the input transistor into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), signal attenuators, impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHZ WLAN band (e.g., from 2400 to 2480 MHZ), a 5 GHZ WLAN band (e.g., from 5180 to 5825 MHZ), a Wi-Fi® 6E band (e.g., from 5925-7125 MHz), and/or other Wi-Fi® bands (e.g., from 1875-5160 MHZ), wireless personal area network transceiver circuitry that handles the 2.4 GHZ Bluetooth® band or other WPAN communications bands, cellular telephone transceiver circuitry that handles cellular telephone bands (e.g., bands from about 600 MHz to about 5 GHZ, 3G bands, 4G LTE bands, 5G New Radio Frequency Range 1 (FR1) bands below 10 GHZ, 5G New Radio Frequency Range 2 (FR2) bands between 20 and 60 GHz, etc.), near-field communications (NFC) transceiver circuitry that handles near-field communications bands (e.g., at 13.56 MHZ), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, radio transceiver circuitry that handles unlicensed radio bands reserved for industrial, scientific, and medical (ISM) purposes, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
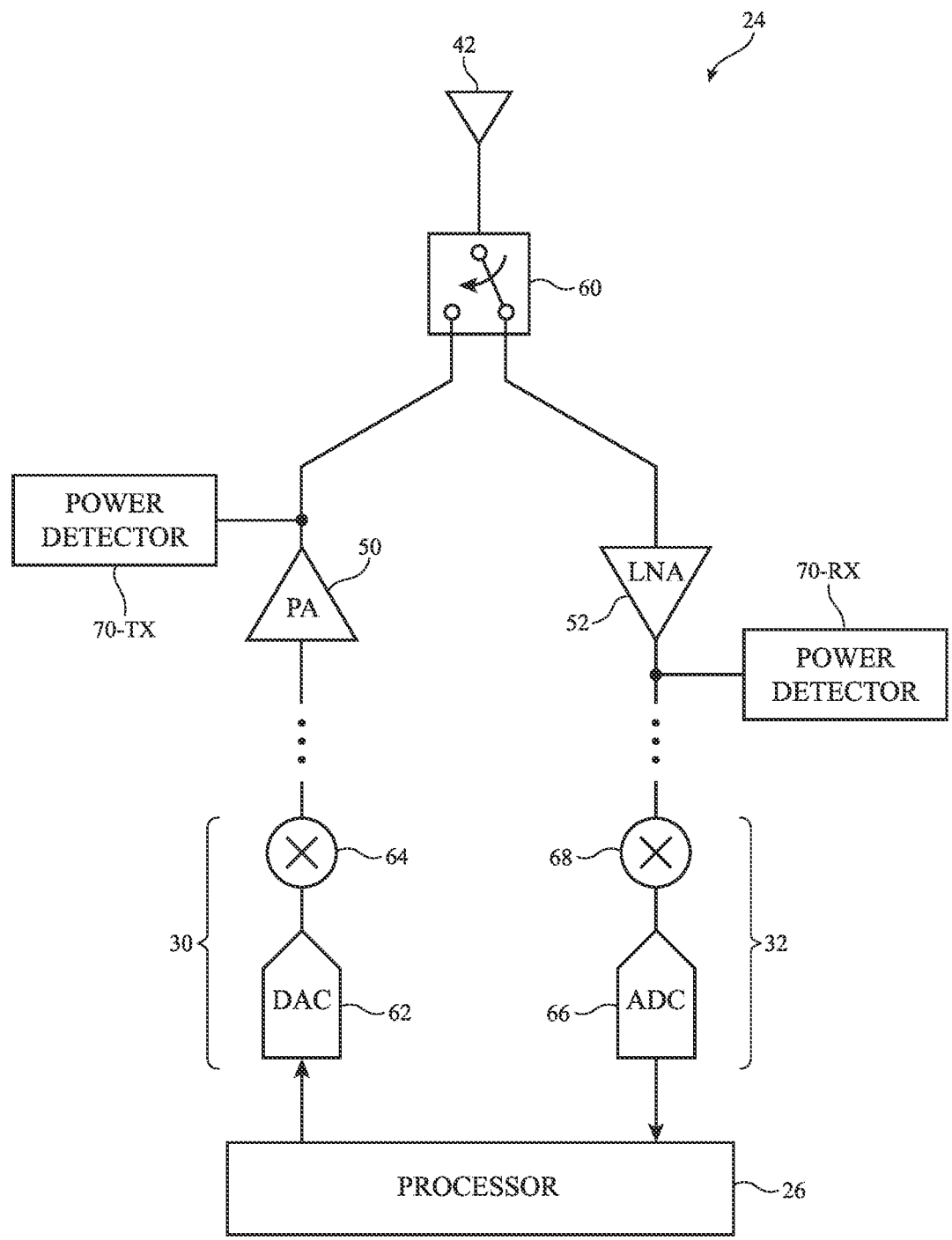
FIG. 3 is a diagram showing illustrative power detectors coupled to radio-frequency amplifiers in accordance with some embodiments.

Radio-frequency amplifiers may be coupled to power detectors for power monitoring purposes. FIG. 3 is a diagram showing illustrative power detectors coupled to radio-frequency amplifier outputs. As shown in FIG. 3, wireless circuitry 24 can have one or more antenna 42 that is coupled to a transmit path and a receive path via a radio-frequency duplexing circuit such as duplexer 60. Duplexer 60 may have a first port coupled to a shared antenna 42, a second port coupled to the transmit path (e.g., a second port configured to receive amplified radio-frequency signals to be radiated by antenna 42), and a third port coupled to the receive path (e.g., a third port to which radio-frequency signals received by antenna 42 are conveyed). This example in which the transmit path and the receive path are coupled to a shared antenna via a duplexer 60 is illustrative. In other embodiments, the transmit path and the receive path can be coupled to separate antennas.

The receive path can include low noise amplifier (LNA) circuitry 52, a downconverting mixing circuit such as mixer 68, and a data converter such as analog-to-digital converter (ADC) 66. The LNA circuitry 52 can include one or more amplifiers coupled in series and/or in parallel. Mixer 68 may use a local oscillator signal to downconvert (or demodulate) the radio-frequency signals to baseband (or intermediate) frequencies. Analog-to-digital converter (ADC) circuit 66 can then convert the demodulated signals from the analog domain to the digital domain to generate corresponding digital baseband signals. Mixer 68 and ADC circuit 66 are sometimes be considered part of receiver circuitry 32. The digital baseband signals can then be received by one or more processors 26. Processor 26 may represent one or more processors such as a baseband processor, an application processor, a digital signal processor, a microcontroller, a microprocessor, a central processing unit (CPU), a programmable device, a combination of these circuits, and/or one or more processors within circuitry 18 (see FIG. 1).

The circuitry described above for processing signals received by antenna 42 is sometimes referred to collectively as wireless receiving circuitry. If desired, one or more additional front end module components such as radio-frequency filter circuitry 44 of FIG. 2 (e.g., low pass filters, high pass filters, notch filters, band pass filters, attenuators, multiplexing circuitry, duplexer circuitry, diplexer circuitry, triplexer circuitry, etc.), switching circuitry 46 (e.g., one or more radio-frequency switches), impedance matching circuitry, antenna tuning circuitry (e.g., networks of capacitors, resistors, inductors, and/or switches that adjust the frequency response of antenna 42), radio-frequency coupler circuitry, charge pump circuitry, power management circuitry, and/or any other desired front-end module circuitry can optionally be coupled at the input and/or output of LNA circuitry 52 along the radio-frequency reception line path.

On the other hand, the transmit path can include power amplifier (PA) circuitry 50, a upconverting mixing circuit such as mixer 64, and a data converter such as digital-to-analog converter (DAC) 62. Processor 26 can generate digital baseband signals, sometimes referred to as digital signals for transmission. DAC circuit 62 can convert the digital baseband signals from the digital domain to the analog domain to generate corresponding analog baseband signals. Mixer 64 may use a local oscillator signal to upconvert (or modulate) the radio-frequency signals to radio (or intermediate) frequencies. DAC circuit 62 and mixer 64 are sometimes be considered part of transmitter circuitry 30. The upconverted radio-frequency signals can then be fed to amplifier circuitry 50. The PA circuitry 52 can include one or more amplifiers coupled in series and/or in parallel that are configured to amplify signals for transmission by antenna 42.

The circuitry described above for preparing signals for transmission by antenna 42 is sometimes referred to collectively as wireless transmitting circuitry. If desired, one or more additional front end module components such as radio-frequency filter circuitry 44 of FIG. 2 (e.g., low pass filters, high pass filters, notch filters, band pass filters, attenuators, multiplexing circuitry, duplexer circuitry, diplexer circuitry, triplexer circuitry, etc.), switching circuitry 46 (e.g., one or more radio-frequency switches), impedance matching circuitry, antenna tuning circuitry (e.g., networks of capacitors, resistors, inductors, and/or switches that adjust the frequency response of antenna 42), radio-frequency coupler circuitry, charge pump circuitry, power management circuitry, and/or any other desired front-end module circuitry can optionally be coupled at the input and/or output of amplifier circuitry 50 along the radio-frequency transmission line path.

Power detection circuits can be coupled to the outputs of the radio-frequency amplifiers to enable power monitoring operations. Still referring to FIG. 3, a first power detection circuit such as power detector 70-TX may be coupled to the output of transmitting amplifier circuitry 50, whereas a second power detection circuit such as power detector 70-RX may be coupled to the output of receiving amplifier circuitry 52. Power detector 70-TX can be used to detect or measure an output power level of radio-frequency signals generated at the output of amplifier circuitry 50. The detected output power level can then be used by an automatic power control (APC) algorithm to dynamically adjust the gain of power amplifier circuitry 50 to ensure that the transmit path is outputting signals at desired power levels. The APC algorithm, which can run on processor 26 or other control circuitry in device 10, can compare the measured output power level to a reference power level. If the output power level is too high, the APC algorithm can reduce the gain of amplifier 50. If the output power level is too low, the APC algorithm can increase the gain of amplifier 50.

Power detector 70-RX can be used to detect or measure an output power level of radio-frequency signals generated at the output of receiving amplifier circuitry 52. The detected output power level can then be used by an automatic gain control (AGC) algorithm to dynamically adjust the gain of LNA circuitry 52 to ensure that the receive path is outputting signals at desired power levels regardless of the strength of signals arriving at the input of circuitry 52. The AGC algorithm, which can run on processor 26 or other control circuitry in device 10, can be used to ensure that signals are output from circuitry 52 at a constant output power level. If the input signal is weak, the AGC algorithm can increase the gain of amplifier 52 to maintain constant output level. If the input signal is strong, then the AGC algorithm can reduce the gain of amplifier 52 to prevent the output level from becoming too high.

The example of FIG. 3 in which power detectors 70-TX and 70-RX are coupled at the radio-frequency amplifier outputs is illustrative. If desired, one or more power detectors can be coupled at the output of DAC 62, at the output of mixer 64, and/or at any other point(s) along the transmit path, at the output of mixer 68, at the output of ADC 66, and/or at any other point(s) along the receive path.

Figure 4:
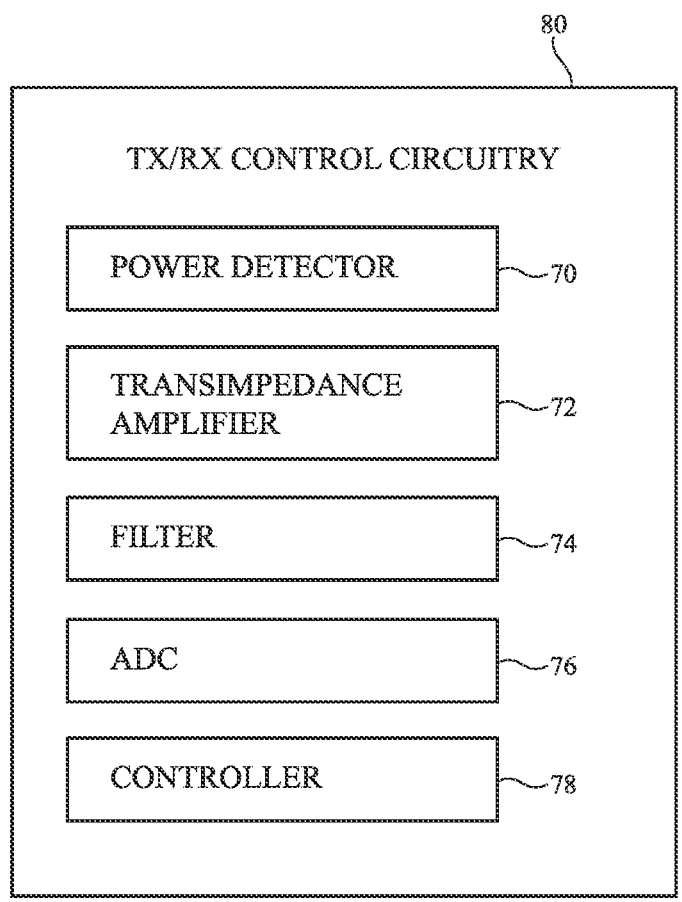
FIG. 4 is a diagram of illustrative transmit or receive control circuitry in accordance with some embodiments.

A power detector 70 is sometimes considered part of transmit (TX) or receive (RX) control circuitry 80 (see, e.g., FIG. 4). Transmit control circuitry 80 can include a transmit power detector 70 (sec, e.g., power detector 70-TX coupled to the output of power amplifier 50 in FIG. 3 or to any other node along the transmit path), whereas receive control circuitry 80 can include a receive power detector 70 (see, e.g., power detector 70-RX coupled to the output of LNA 52 in FIG. 3 or to any other node along the receive path). As shown in FIG. 4, TX/RX control circuitry 80 can further include an amplifier such as a transimpedance amplifier 72, a filtering circuit such as filter 74, a data converter such as analog-to-digital converter (ADC) 76, and a controller 78.

Power detector 70 can have an output that is coupled to transimpedance amplifier 72 (e.g., transimpedance amplifier 72 can have an input configured to receive signals from power detector 70). Transimpedance amplifier 72 can refer to and be defined herein as a circuit that is configured to convert an input current signal to a corresponding output voltage signal. Transimpedance amplifier 72 may have an output that is coupled to filter 74 (e.g., filter 74 can have an input configured to receive signals from amplifier 72). Filter 74 can be an antialiasing filter (as an example). Filter 74 may have an output that is coupled to ADC circuit 76 (e.g., ADC 76 can have an input configured to receive signals from filter 74). ADC circuit 76 can output corresponding digital signals to controller 78. Controller 78 within TX control circuitry 80 may be used to run or execute an APC algorithm for controlling power amplifier circuitry 50, whereas controller 78 within RX control circuitry 80 may be used to run or execute or an AGC algorithm for controlling receive LNA circuitry 52. In general, controller 78 may be formed as part of processor 26 (see FIGS. 2 and 3), processing circuitry 18 (see FIG. 1), or other processing subsystem on device 10. The example of FIG. 5 in which power detector 70 has outputs coupled to a transimpedance amplifier 72 is illustrative. In general, the output of power detector 70 can be coupled to other types of downstream processing circuitry or control circuitry.

Figure 5:
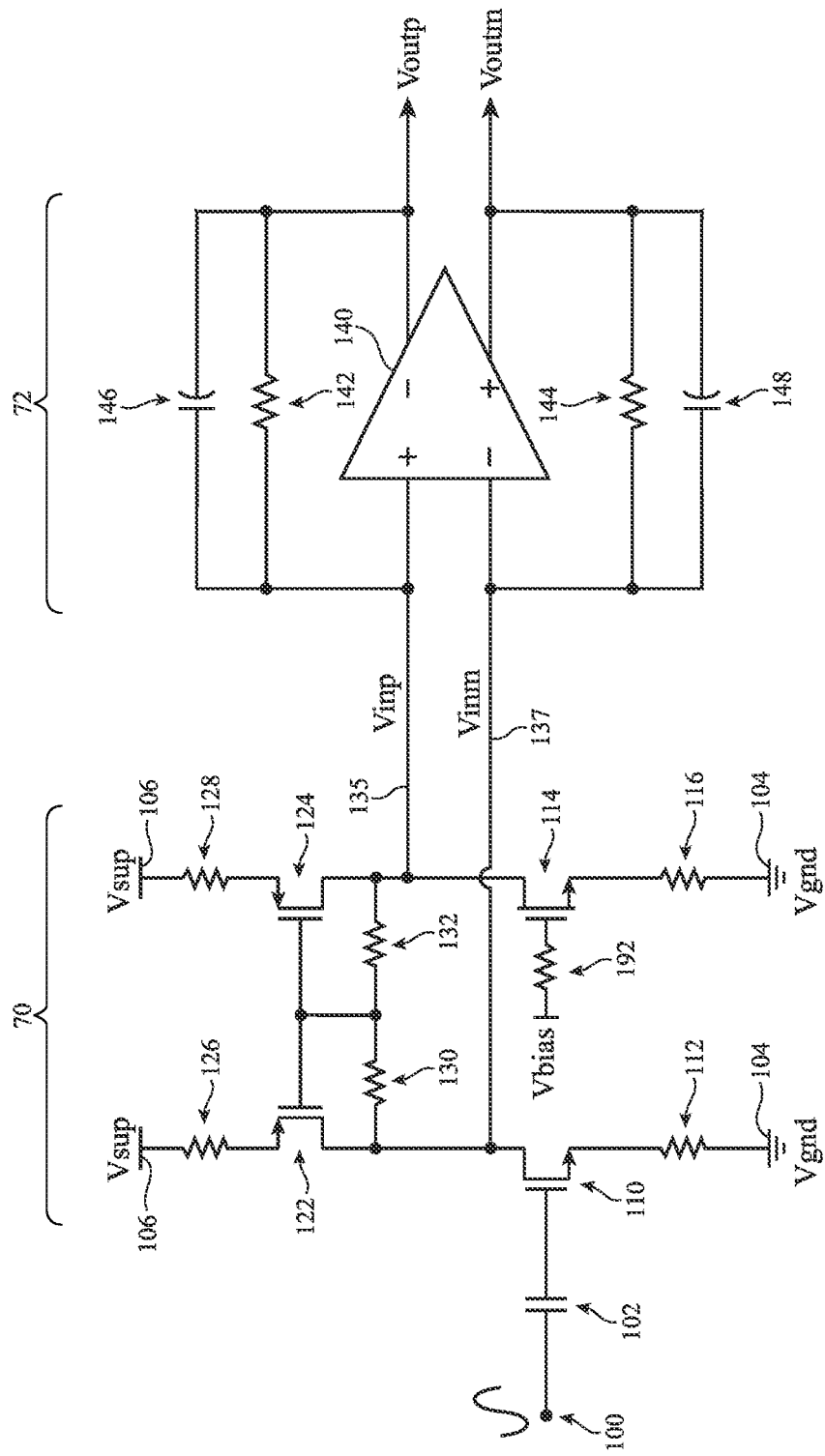
FIG. 5 is a circuit diagram of an illustrative power detector coupled to a transimpedance amplifier in accordance with some embodiments.

FIG. 5 is a circuit diagram of an illustrative power detection circuit 70 with a single-ended input. As shown in FIG. 5, power detection circuit 70 may include an input transistor 110, a bias transistor 114, a first load transistor 122, and a second load transistor 124. Transistors 110, and 114 can be n-type metal-oxide-semiconductor (NMOS) transistors, whereas load transistors 122 and 124 can be p-type metal-oxide-semiconductor (PMOS) transistors. Input transistor 110 may have a gate terminal coupled to an input port 100 via an alternating current (AC) coupling capacitor 102, a source terminal coupled to a ground line 104 (e.g., a ground power supply line on which ground voltage Vgnd is provided) via degeneration resistor 112, and a drain terminal coupled to a first power detector output path 137 on which voltage Vinm is provided. A degeneration resistor can refer to and be defined herein as a resistor that is coupled to (at) the source terminal of a transistor. Resistor 112 is optional. If desired, a cascode transistor may be coupled between the drain terminal of input transistor 110 and the first output path 137. Input port 100 may be coupled to an output of a radio-frequency amplifier, mixer, or data converter (e.g., power detector input port 100 may be configured to receive a radio-frequency signal from an associated wireless circuit). The signal received at input port 100 may be a radio-frequency signal or other AC signal. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

Bias transistor 114 may have a source terminal coupled to the ground line 104 via degeneration resistor 116, a gate terminal configured to receive bias voltage Vbias via a series resistor 192, and a drain terminal coupled to a second power detector output path 135 on which voltage Vinp is provided. Resistors 116 and 192 are optional. If desired, a cascode transistor may be coupled between the drain terminal of bias transistor 114 and the second output path 135. Bias transistor 114 can be sized equally to input transistor 110 and can sometimes be referred to and defined herein as a "replica bias transistor." Configured in this way, transistors 110 and 114 may be operated to perform an AC voltage to DC current conversion and is sometimes referred to as an AC-to-DC converter or a squaring circuit. A squaring circuit can refer to and be defined herein as a subcircuit configured to perform a squaring function $x^2$ for an input signal x received at the input port.

Load transistor 122 may have a drain terminal coupled to output path 137, a gate terminal that is coupled to its own drain terminal via resistor 130, and a source terminal coupled to power supply line 106 (e.g., a positive power supply line on which supply voltage Vsup is provided) via source/degeneration resistor 126. Similarly, load transistor 124 may have a drain terminal coupled to output path 135, a gate terminal that is coupled to its own drain terminal via resistor 132, and a source terminal coupled to power supply line 106 via source/degeneration resistor 128. Resistors 126 and 128 are optional. Output paths 135 and 137 may collectively serve as an output for power detector 70. The node coupled between transistors 110 and 122 and coupled to output path 137 can be referred to as a first output port for power detector 70, whereas the node code between transistors 114 and 124 and coupled to output path 135 can be referred to as a second output port for power detector 70, or vice versa.

The node interposed between input transistor 110 and first load transistor 122 is sometimes referred to as a first power detector output port. The node interposed between bias transistor 114 and second load transistor 124 is sometimes referred to as a second power detector output port. The output ports of power detector can be coupled to inputs of transimpedance amplifier 72 (e.g., a differential amplifier). In the example of FIG. 5, the first power detector output port is coupled to a first (negative) input of amplifier 72 via path 137, whereas the second power detector output port is coupled to a second (positive) input of amplifier 72 via path 135.

Transimpedance amplifier 72 can further include a first output on which output voltage Voutm is generated, a second output on which output voltage Voutp is generated, feedback resistor 142 and capacitor 146 coupled between the second input and the second output of amplifier 72, and feedback resistor 144 and capacitor 148 coupled between the first input and the first output of amplifier 72. The circuit structure of transimpedance amplifier 72 as shown in FIG. 5 is exemplary. Other types of transimpedance amplifiers can be employed. The output of amplifier 72 can optionally be coupled to one or more filters, to one or more ADCs 76, and/or to one or more controller 78 as described in connection with FIG. 4. The use of transimpedance amplifier 72 at the output of power detector 70 can be technically advantageous and beneficial by providing the overall power detection circuitry with better sensitivity (e.g., to detect smaller signals), a more linear power detector response, and reduced modulation error. Amplifier 72 is sometimes referred to as a power detector output stage.

Figure 6:
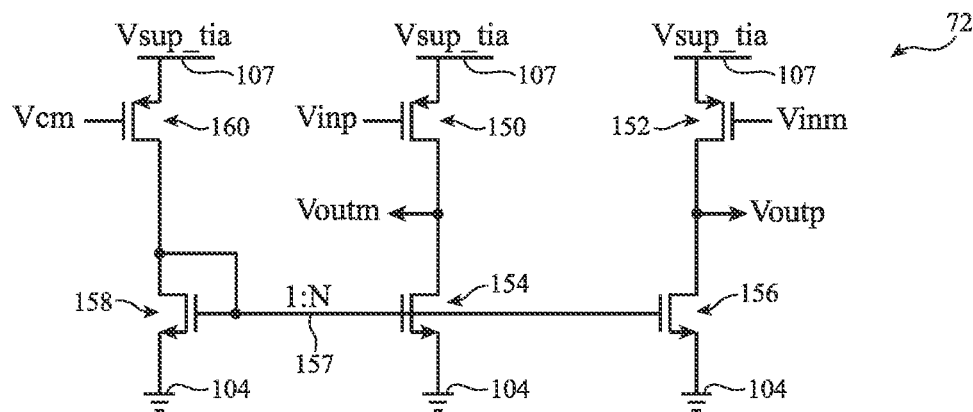
FIG. 6 is a circuit diagram of an illustrative "class A" transimpedance amplifier in accordance with some embodiments.

Amplifier 72 can be implemented in various ways. FIG. 6 is a circuit diagram of an illustrative "class A" transimpedance amplifier 72 in accordance with some embodiments. As shown in FIG. 6, transimpedance amplifier 72 may include transistors 150, 152, 154, 156, 158, and 160. Transistors 150, 152, and 160 may be p-type or PMOS transistors, whereas transistors 154, 156, and 158 may be n-type or NMOS transistors. Transistor 150 may have a source terminal coupled to a positive power supply line 107 (e.g., a power supply terminal on which positive power supply voltage Vsup_tia is provided), a gate terminal configured to receive voltage Vinp from power detector output path 135 (see FIG. 5), and a drain terminal on which output voltage Voutm is provided. Transistor 152 may have a source terminal coupled to positive power supply line 107, a gate terminal configured to receive voltage Vinm from power detector output path 137, and a drain terminal on which output voltage Voutp is provided. Power supply line 107 can be the same or different than power supply line 106 of FIG. 5. Voltage Vsup_tia can be equal to or different than power supply voltage Vsup. Transistors 150 and 152 configured to receive voltages Vinp and Vinm from power detector 70 are sometimes referred to collective as the input transistors of transimpedance amplifier 72.

Transistor 154 may have a drain terminal coupled to transistor 150, a source terminal coupled to ground line 104, and a gate terminal. Transistor 156 may have a drain terminal coupled to transistor 152, a source terminal coupled to ground line 104, and a gate terminal shorted to the gate terminal of transistor 154. Transistor 158 may have a source terminal coupled to ground line 104, a gate terminal shorted to the gate terminal of transistor 154 via path 157, and a drain terminal that is shorted to its own gate terminal. Transistor 158 having its drain and gate terminals shorted together is sometimes referred to as a diode-connected transistor. Transistor 160 may have a drain terminal coupled to transistor 158, a source terminal coupled to power supply line 107, and a gate terminal configured to receive a common mode voltage Vcm (e.g., a fixed or static voltage).

Transistor 158 configured in this way may serve as a current mirror that mirrors the current flowing through itself onto the currents flowing through transistors 154 and 156. The amount of current being mirrored can be a function of the sizing of transistor 158 to the sizing of transistors 154 and 156. Transistors 154 and 156 can have identical sizing. Here, transistor 154 (and also transistor 156) can be sized N times larger than current mirror transistor 158. N can represent any integer equal to 1, 1-5, 5-10, 10-100, or greater than 100. Configured in this way, the amount of current flowing through transistors 154 and 156 can be N times larger than the amount of current flowing through transistor 158. If desired, N can also be a fraction. A class A transimpedance amplifier 72 of the type shown in FIG. 6 can exhibit small area overhead, low power consumption due to only three current branches, and improved modulation error. If desired, the polarity of the NMOS and PMOS transistors can be swapped. If desired, more sophisticated current mirror configurations (e.g., amplifier arrangements that include cascode transistors and/or additional degeneration components) can be employed.

Figure 7:
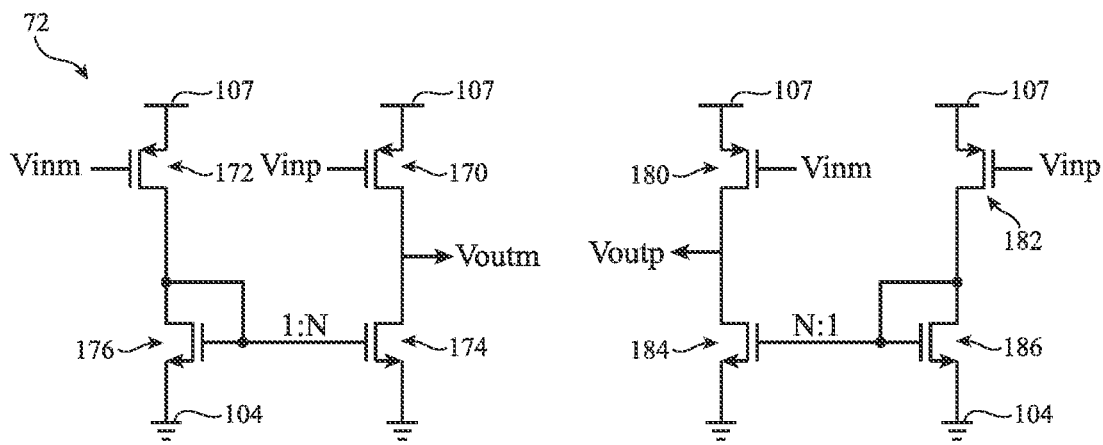
FIG. 7 is a circuit diagram of an illustrative "class AB" transimpedance amplifier in accordance with some embodiments.

FIG. 7 is a circuit diagram of an illustrative "class AB" transimpedance amplifier 72 in accordance with some embodiments. As shown in FIG. 7, transimpedance amplifier 72 may include transistors 170, 172, 174, 176, 180, 182, 184, and 186. Transistors 170, 172, 180, and 182 may be p-type or PMOS transistors, whereas transistors 174, 176, 184, and 186 may be n-type or NMOS transistors.

Transistor 170 may have a source terminal coupled to positive power supply line 107, a gate terminal configured to receive voltage Vinp from power detector output path 135 (see FIG. 5), and a drain terminal on which output voltage Voutm is provided. Transistor 180 may have a source terminal coupled to positive power supply line 107, a gate terminal configured to receive voltage Vinm from power detector output path 137, and a drain terminal on which output voltage Voutp is provided. Transistors 170 and 180 configured to receive voltages Vinp and Vinm from power detector 70 are sometimes referred to collective as the input transistors of transimpedance amplifier 72.

Transistor 174 may have a drain terminal coupled to transistor 170, a source terminal coupled to ground line 104, and a gate terminal. Transistor 176 may have a source terminal coupled to ground line 104, a gate terminal shorted to the gate terminal of transistor 174, and a drain terminal that is shorted to its own gate terminal. Transistor 176 having its drain and gate terminals shorted together is sometimes referred to as a diode-connected transistor. Transistor 172 may have a drain terminal coupled to transistor 176, a source terminal coupled to power supply line 107, and a gate terminal configured to receive input voltage Vinm (e.g., the gate terminal of transistor 172 may be coupled to the gate terminal of transistor 180 and both receive Vinm). Transistor 172 is therefore also sometimes referred to as being one of the input transistors of transimpedance amplifier 72.

Transistor 176 configured in this way may serve as a current mirror that mirrors the current flowing through itself onto the current flowing through transistor 174. The amount of current being mirrored can be a function of the sizing of transistor 176 to the sizing of transistor 174. Transistors 174 and 184 can have identical sizing. Here, transistor 174 can be sized N times larger than current mirror transistor 176. N can represent any integer equal to 1, 1-5, 5-10, 10-100, or greater than 100. Configured in this way, the amount of current flowing through transistor 174 can be N times larger than the amount of current flowing through transistor 176. If desired, N can also be a fraction.

Transistor 184 may have a drain terminal coupled to transistor 180, a source terminal coupled to ground line 104, and a gate terminal. Transistor 186 may have a source terminal coupled to ground line 104, a gate terminal shorted to the gate terminal of transistor 184, and a drain terminal that is shorted to its own gate terminal. Transistor 186 having its drain and gate terminals shorted together is sometimes referred to as a diode-connected transistor. Transistor 182 may have a drain terminal coupled to transistor 186, a source terminal coupled to power supply line 107, and a gate terminal configured to receive input voltage Vinp (e.g., the gate terminal of transistor 182 may be coupled to the gate terminal of transistor 170 and both receive Vinp). Transistor 182 is therefore also sometimes referred to as being one of the input transistors of transimpedance amplifier 72.

Transistor 186 configured in this way may also serve as a current mirror that mirrors the current flowing through itself onto the current flowing through transistor 184. The amount of current being mirrored can be a function of the sizing of transistor 186 to the sizing of transistor 184. Here, transistor 184 can be sized N times larger than current mirror transistor 186. N can represent any integer equal to 1, 1-5, 5-10, 10-100, or greater than 100. Configured in this way, the amount of current flowing through transistor 184 can be N times larger than the amount of current flowing through transistor 186. If desired, N can also be a fraction.

A class AB transimpedance amplifier 72 of the type shown in FIG. 7 can exhibit high amplifier gain (e.g., more than 6 dB of gain) and improved modulation error at the cost of slightly higher power consumption due to the four current branches. If desired, the polarity of the NMOS and PMOS transistors can be swapped. If desired, more sophisticated current mirror configurations (e.g., amplifier arrangements that include cascode transistors and/or additional degeneration components) can be employed.

Figure 8:
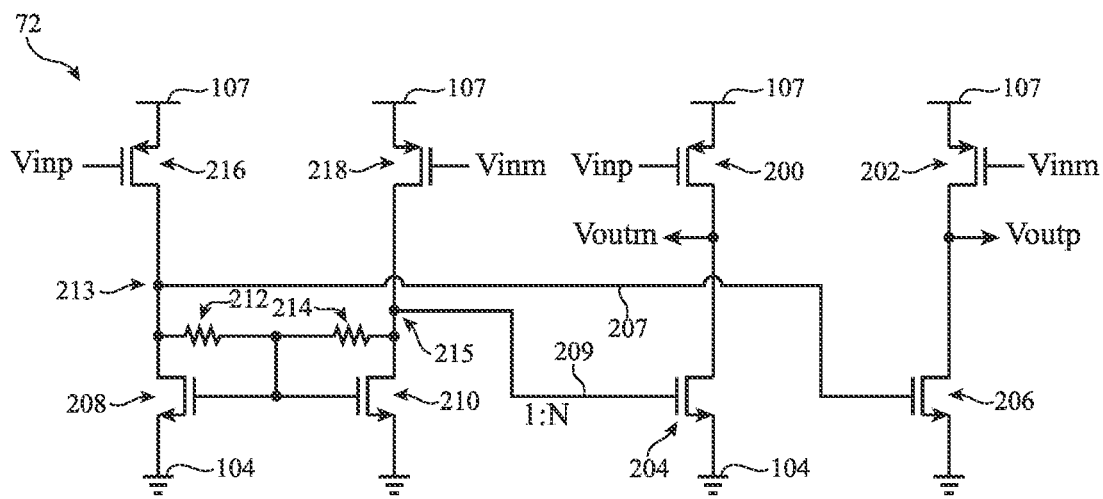
FIG. 8 a circuit diagram of an illustrative "enhanced class AB" transimpedance amplifier in accordance with some embodiments.

FIG. 8 is a circuit diagram of an illustrative "enhanced class AB" transimpedance amplifier 72 in accordance with some embodiments. As shown in FIG. 8, transimpedance amplifier 72 may include at least transistors 200, 202, 204, 206, 208, 210, 216, and 218. Transistors 200, 202, 216, and 218 may be p-type or PMOS transistors, whereas transistors 204, 206, 208, and 210 may be n-type or NMOS transistors. Transistor 200 may have a source terminal coupled to positive power supply line 107, a gate terminal configured to receive voltage Vinp from power detector output path 135 (see FIG. 5), and a drain terminal on which output voltage Voutm is provided. Transistor 202 may have a source terminal coupled to positive power supply line 107, a gate terminal configured to receive voltage Vinm from power detector output path 137, and a drain terminal on which output voltage Voutp is provided. Transistors 200 and 202 configured to receive voltages Vinp and Vinm from power detector 70 are sometimes referred to collective as the input transistors of transimpedance amplifier 72.

Transistor 204 may have a drain terminal coupled to transistor 200, a source terminal coupled to ground line 104, and a gate terminal coupled to node 215 via path 209. Transistor 206 may have a drain terminal coupled to transistor 202, a source terminal coupled to ground line 104, and a gate terminal coupled to node 213 via path 207. Transistor 216 may have a source terminal coupled to power supply line 107, a drain terminal coupled to node 213, and a gate terminal configured to receive input voltage Vinp (e.g., the gate terminal of transistor 216 may be coupled to the gate terminal of transistor 200 and both receive Vinp). Transistor 218 may have a source terminal coupled to power supply line 107, a drain terminal coupled to node 215, and a gate terminal configured to receive input voltage Vinm (e.g., the gate terminal of transistor 218 may be coupled to the gate terminal of transistor 202 and both receive Vinm). Transistors 216 and 218 are therefore also sometimes referred to as being part of the input transistors of transimpedance amplifier 72.

Transistor 208 may have a drain terminal coupled to node 213, a source terminal coupled to ground line 104, and a gate terminal coupled to its own drain terminal via resistor 212. Transistor 210 may have a drain terminal coupled to node 215, a source terminal coupled to ground line 104, and a gate terminal coupled to its own drain terminal via resistor 214. Transistors 208 and 210 configured in this way may also serve as a current mirror that mirrors the current flowing through themselves onto the current flowing through transistors 204 and 206. The amount of current being mirrored can be a function of the sizing of transistor 208 (and 210) to the sizing of transistor 206 (and 204), respectively. Transistors 204 and 206 can be identically sized. Here, transistor 204 can be sized N times larger than current mirror transistor 210. N can represent any integer equal to 1, 1-5, 5-10, 10-100, or greater than 100. Configured in this way, the amount of current flowing through transistor 204 can be N times larger than the amount of current flowing through transistor 210. If desired, N can also be a fraction.

An enhanced class AB transimpedance amplifier 72 of the type shown in FIG. 8 can exhibit high amplifier gain (e.g., more than 6 dB of gain) and a minimal amount of modulation error at the cost of slightly higher power consumption due to the four current branches. If desired, the polarity of the NMOS and PMOS transistors can be swapped. If desired, more sophisticated current mirror configurations (e.g., amplifier arrangements that include cascode transistors and/or additional degeneration components) can be employed.

The embodiments of FIGS. 6-8 showing various types of transimpedance amplifiers 72 that can be implemented as an output stage of a radio-frequency power detector are exemplary. If desired, transimpedance amplifier can be implemented as a multi-stage transimpedance amplifier (e.g., an amplifier having multiple TIA stages cascaded together, each stage using the same amplifier type or different amplifier type), a voltage-feedback transimpedance amplifier (e.g., an amplifier having one or more feedback resistor for converting an output voltage back into a current signal), a current-feedback transimpedance amplifier (e.g., an amplifier having a feedback loop implemented using a current amplifier instead of a voltage amplifier), or other types of transimpedance amplifier. The examples of FIGS. 6-8 show transimpedance amplifiers 72 with single-ended inputs. This is illustrative. Transimpedance amplifiers 72 with differential inputs can also be used. For example, differential transimpedance amplifiers can have two parallel input branches that are shorted in parallel and the DC output can be summed together.

Figure 9:
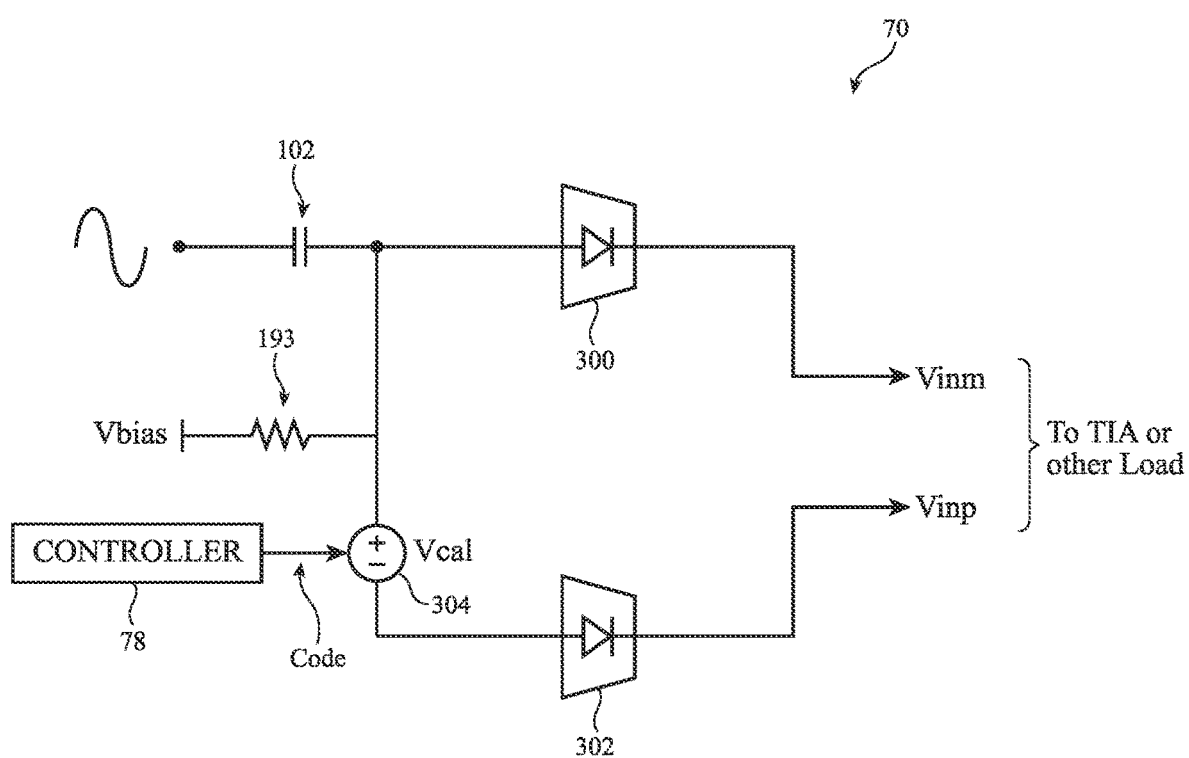
FIG. 9 is a block diagram of an illustrative power detector provided with a calibration voltage generator in accordance with some embodiments.

Transimpedance amplifier 72 helps reduce modulation error for power detector 70 at the output side. At the input side, power detector 70 can be subject to DC offset. Such DC offset in the power detector 70 can vary as a function of operating temperature. As temperature varies during operation of device 10, the DC offset can drift, which can introduce measurement error for power detector 70. The effect of the DC offset is exacerbated at small radio-frequency signals. In accordance with some embodiments, power detector 70 can be provided with a calibration voltage (Vcal) generator at the input of the power detector 70 to provide DC offset correction or mitigation (see, e.g., block diagram of power detector 70 in FIG. 9). As shown in FIG. 9, power detector 70 can include a main squaring circuit such as main squarer 300 and a replica bias squaring circuit such as replica bias squarer 302. Main squarer 300 may represent components in the input branch (e.g., input transistor 110, load transistor 122, and/or other components that are coupled in series with input transistor 110), can receive an input AC signal via capacitor 102, and can output voltage Vinm to transimpedance amplifier 72 or other load circuit. Replica bias squarer 302 may represent components in the bias branch (e.g., bias transistor 114, load transistor 124, and/or other components that are coupled in series with bias transistor 114), can receive a bias voltage Vbias via resistor 193, and can output voltage Vinp to transimpedance amplifier 72 or other load circuit.

Calibration voltage generator 304 can be coupled to the input of replica bias squarer 302. Calibration voltage generator 304 may be controlled by controller 78 (see also FIG. 4). Controller 78 can output a code to calibration voltage generator 304 and depending on the value of the code, generator 304 can output a corresponding calibration voltage Vcal for counteracting any DC offset within power detector 70. Configured in this way, calibration voltage generator 304 effectively adds a delta gate-to-source voltage between the main and replica bias transistors. The code output by controller 78 can be dynamically adjusted as a function of temperature to provide improved tracking of DC offset across a wide range of operating temperatures. Device 10 may optionally include a temperature sensor within input-output circuitry 20 (FIG. 1) for monitoring the temperature of device 10. The code output by controller 78 for controlling the calibration voltage generator 304 can have 3 or more bits, 5-10 bits, more than 10 bits, or any suitable number of bits for adjusting Vcal to provide the desired DC offset correction resolution.

Figure 10:
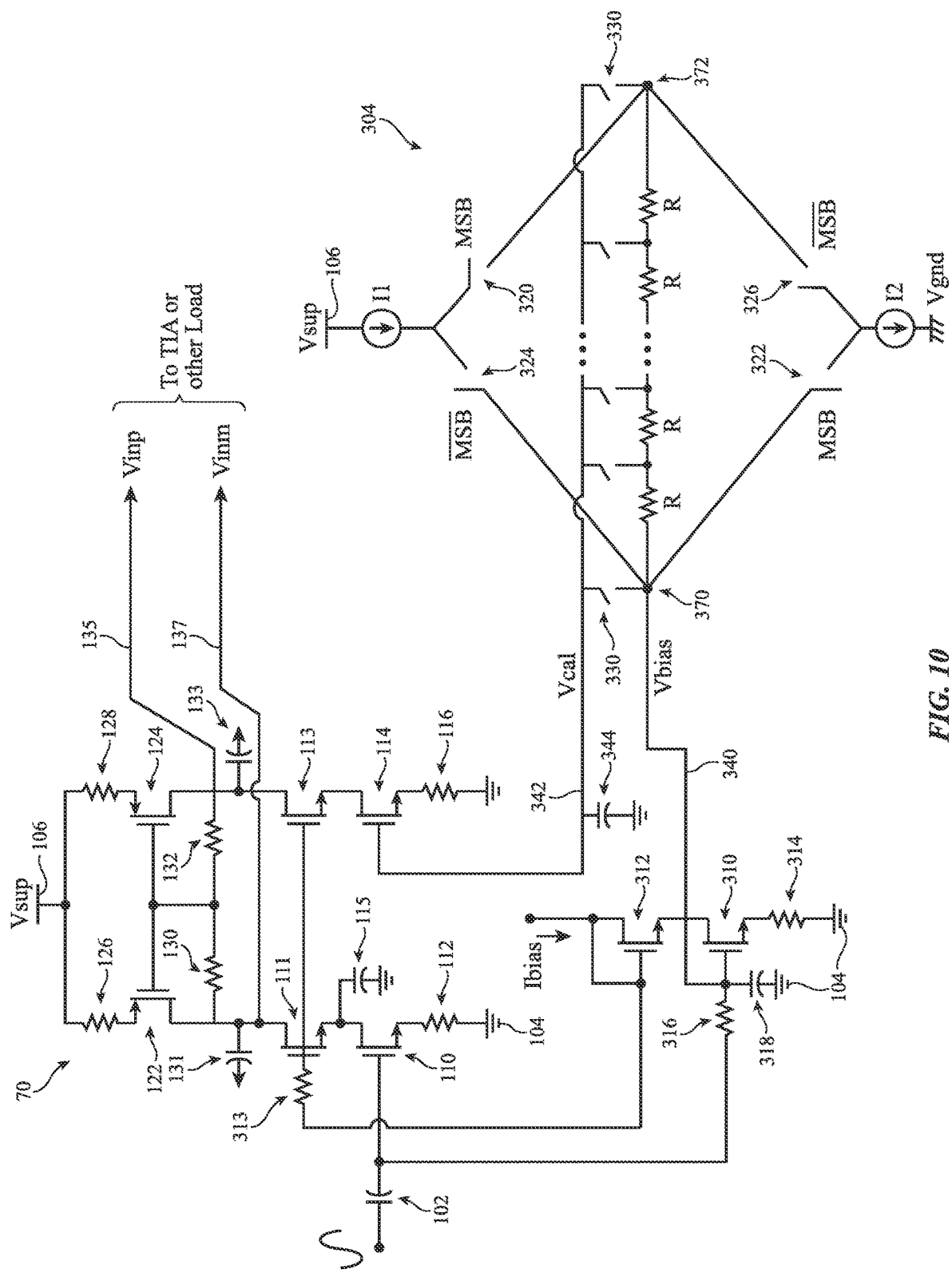
FIG. 10 is a circuit diagram of the power detector shown in FIG. 9 in accordance with some embodiments.

FIG. 10 is a circuit diagram of power detector 70 of the type described in connection with FIG. 9. The power detector 70 of FIG. 10 is similar to the power detector 70 of FIG. 5, but the power detector 70 of FIG. 10 includes additional cascode transistors such as cascode transistors 111 and 113. Cascode transistor 111 may have a source terminal coupled to input transistor 110, a drain terminal coupled to first load transistor 122, and a gate terminal. Cascode transistor 113 may have a source terminal coupled to bias transistor 114, a drain terminal coupled to second load transistor 128, and a gate terminal shorted to the gate terminal of cascode transistor 111. A first shunt capacitor 131 can be coupled at the first output port of power detector 70, whereas a second shunt capacitor 133 can be coupled at the second output port of power detector 70. A third shunt capacitor 115 can be coupled to a node interposed between input transistor 110 and cascode transistor 111. Cascode transistors 111 and 113 can help provide better immunity to process variations but are optional.

Power detector 70 may be coupled to additional bias transistors such as bias transistors 310 and 312. The additional bias transistors 310 and 312 can be n-type or NMOS transistors. Transistor 310 may have a gate terminal coupled to the gate terminal of input transistor 110 via series resistor 316, a drain terminal coupled to its own gate terminal, and a source terminal coupled to ground line 104 via degeneration resistor 314. A shunt capacitor 318 can also be coupled to the gate terminal of transistor 310. Transistor 312 may have a source terminal coupled to transistor 310, a gate terminal coupled to the gate terminals of the cascode transistors 111 and 113 via series resistor 313, and a drain terminal shorted to its own gate terminal and configured to receive bias current Ibias. In the example of FIG. 10, both bias transistors 310 and 312 are diode-connected transistors. Bias transistors 310 and 312 (and optionally components 316 and 318) are sometimes referred to collectively as a bias circuit. If desired, a more sophisticated biasing scheme for outputting Vbias can be employed.

The additional bias transistors 310 and 312 may be configured to output bias voltage Vbias on bias voltage path 340. Bias voltage path 340 may be coupled to calibration voltage generator 304. Calibration voltage generator 304 may receive bias voltage Vbias from bias voltage path 340 and output a tunable calibration voltage Vcal to the gate terminal of the replica bias transistor 114. Calibration voltage generator 304 can include a series of resistors R connected in a chain between nodes 370 and 372. Generator 304 can include any number of resistors R in the chain (e.g., 2-10 resistors, 10-20 resistors, 20-50 resistors, 50-100 resistors, or more than 100 resistors). Node 370 may be selectively coupled to current source I1 via switch 324 and may be selectively coupled to current sink I2 via switch 322. Node 372 may be selectively coupled to current source I1 via switch 320 and may be selectively coupled to current sink I2 via switch 326. Switches 320 and 322 can be activated when the most significant bit (MSB) of the code output from controller 78 is high (see FIG. 9). Switches 324 and 326 can be activated when then MSB of the code output from controller 78 is low. A selected one of switches 330 can be activated based on the least significant bits of the code to connect the gate terminal of bias transistor 114 to one of node 370, node 372 or a selected tap point along the resistive chain via path 342. Calibration voltage Vcal is generated on path 342. A shunt capacitor 344 can be coupled to path 342.

Voltage generator 304 configured in this way is sometimes referred to as a digital-to-analog converter (DAC) circuit.

The embodiment of FIG. 10 is exemplary. If desired, the polarity of the NMOS and PMOS transistors can be swapped. The degeneration resistors 112, 116, 126, 128, and 314 are optional. If desired, more sophisticated current mirror or bias configurations can be employed.

Figure 11:
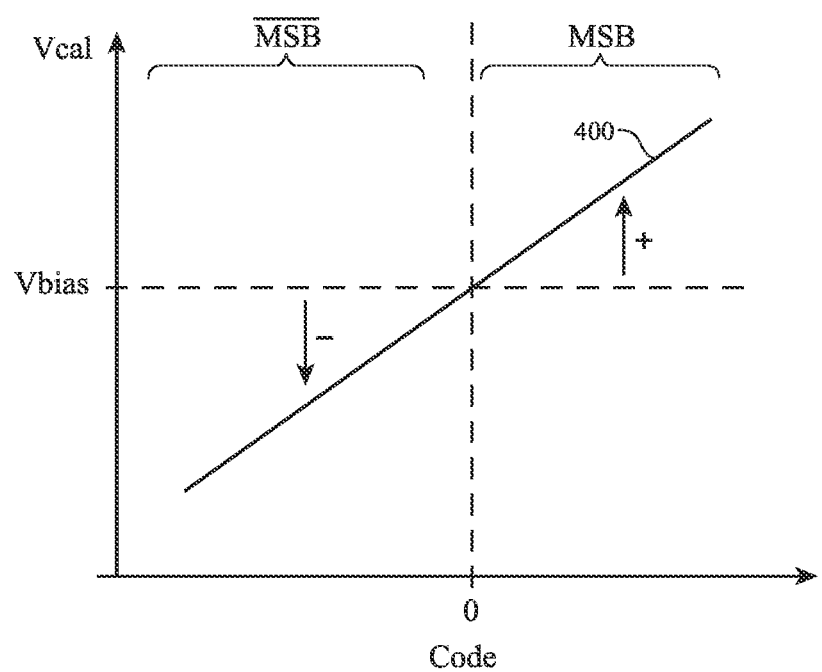
FIG. 11 is a plot showing various calibration voltage levels in accordance with some embodiments.

FIG. 11 is a plot showing various calibration voltage levels in accordance with some embodiments. As shown by line 400 in FIG. 11, calibration voltage Vcal can be centered around Vbias (e.g., when the code output from controller 78 is equal to zero). When the controller code has a high MSB, calibration voltage Vcal can be a certain amount greater than Vbias depending on the LSBs of the code. When the controller code has a low MSB, calibration voltage Vcal can be a certain amount lower than Vbias depending on the LSBs of the code. Operated in this way, generator 304 can generate Vcal to mitigate any DC offset in the power detector as temperature varies. Other configurations for generating higher or lower voltages with respect to Vbias can also be used.

The methods and operations described above in connection with FIGS. 1-11 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Wireless circuitry comprising:
   a radio-frequency amplifier;
   a mixer coupled to the radio-frequency amplifier;
   a power detection circuit coupled to the radio-frequency amplifier or the mixer; and
   a differential amplifier coupled to an output of the power detection circuit, the differential amplifier including
      a first transistor having a first source-drain terminal coupled to a first power supply line, a gate terminal configured to receive a first input voltage from the output of the power detection circuit, and a second source-drain terminal coupled to a first output port of the differential amplifier, and
      a second transistor having a first source-drain terminal coupled to the first power supply line, a gate terminal configured to receive a second input voltage from the output of the power detection circuit, and a second source-drain terminal coupled to a second output port, different than the first output port, of the differential amplifier.

2. The wireless circuitry of claim 1, wherein the power detection circuit comprises:
an input transistor having a gate terminal coupled to the radio-frequency amplifier or the mixer, a first source-drain terminal coupled to the output of the power detection circuit, and a second source-drain terminal coupled to a second power supply line different than the first power supply line; and
a bias transistor having a gate terminal configured to receive a bias voltage, a first source-drain terminal coupled to the output of the power detection circuit, and a second source-drain terminal coupled to the second power supply line.

3. The wireless circuitry of claim 2, wherein the power detection circuit further comprises:
a first load transistor having a first source-drain terminal coupled to the input transistor, a second source drain terminal coupled to the first power supply line, and a gate terminal coupled to its first source-drain terminal via a first resistor; and
a second load transistor having a first source-drain terminal coupled to the bias transistor, a second source drain terminal coupled to the first power supply line, and a gate terminal that is coupled to the gate terminal of the first load transistor and that is coupled to its first source-drain terminal via a second resistor.

4. The wireless circuitry of claim 1, wherein the differential amplifier further comprises:
a third transistor coupled in series with the first transistor;
a fourth transistor coupled in series with the second transistor;
a fifth transistor having a gate terminal coupled to gate terminals of the third and fourth transistors, a first source-drain terminal coupled to a second power supply line different than the first power supply line, and a second source-drain terminal shorted to its gate terminal; and
a sixth transistor having a first source-drain terminal coupled to the second source-drain terminal of the fifth transistor, a second source-drain terminal coupled to the first power supply line, and a gate terminal configured to receive a static voltage.

5. The wireless circuitry of claim 1, wherein the differential amplifier further comprises:
a third transistor coupled in series with the first transistor;
a fourth transistor coupled in series with the second transistor;
a fifth transistor having a gate terminal coupled to gate terminal of the third transistor, a first source-drain terminal coupled to a second power supply line different than the first power supply line, and a second source-drain terminal shorted to its gate terminal; and
a sixth transistor having a gate terminal coupled to gate terminal of the fourth transistor, a first source-drain terminal coupled to the second power supply line, and a second source-drain terminal shorted to its gate terminal.

6. The wireless circuitry of claim 5, wherein the differential amplifier further comprises:
a seventh transistor having a first source-drain terminal coupled to the fifth transistor, a second source-drain terminal coupled to the first power supply line, and a gate terminal coupled to the gate terminal of the second transistor; and
an eighth transistor having a first source-drain terminal coupled to the sixth transistor, a second source-drain terminal coupled to the first power supply line, and a gate terminal coupled to the gate terminal of the first transistor.

7. The wireless circuitry of claim 1, wherein the differential amplifier further comprises:
a third transistor coupled in series with the first transistor;
a fourth transistor coupled in series with the second transistor;
a fifth transistor having a first source-drain terminal coupled to a gate terminal of the third transistor, a second source-drain terminal coupled to a second power supply line different than the first power supply line, and a gate terminal coupled to its first source-drain terminal via a first resistor; and
a sixth transistor having a first source-drain terminal coupled to a gate terminal of the fourth transistor, a second source-drain terminal coupled to the second power supply line, and a gate terminal coupled to its first source-drain terminal via a second resistor.

8. The wireless circuitry of claim 7, further comprising:
a seventh transistor having a first source-drain terminal coupled to the fifth transistor, a second source-drain terminal coupled to the first power supply line, and a gate terminal coupled to the gate terminal of the second transistor; and
an eighth transistor having a first source-drain terminal coupled to the sixth transistor, a second source-drain terminal coupled to the first power supply line, and a gate terminal coupled to the gate terminal of the first transistor.

9. Power detection circuitry comprising:
an input transistor having a gate terminal configured to receive an alternating current (AC) signal, a first source-drain terminal coupled to a first power supply line, and a second source-drain terminal coupled to a first output port of the power detection circuitry;
a replica bias transistor having a first source-drain terminal coupled to the first power supply line and having a second source-drain terminal coupled to a second output port of the power detection circuitry; and
a digital-to-analog converter configured to output a calibration voltage to a gate terminal of the replica bias transistor.

10. The power detection circuitry of claim 9, further comprising:
a first load transistor having a first source-drain terminal coupled to the input transistor, a second source drain terminal coupled to a second power supply line different than the first power supply line, and a gate terminal coupled to its first source-drain terminal via a first resistor; and
a second load transistor having a first source-drain terminal coupled to the replica bias transistor, a second source drain terminal coupled to the second power supply line, and a gate terminal that is coupled to the gate terminal of the first load transistor and that is coupled to its first source-drain terminal via a second resistor.

11. The power detection circuitry of claim 10, further comprising:
a first cascode transistor coupled between the input transistor and the first load transistor; and
a second cascode transistor coupled between the replica bias transistor and the second load transistor.

12. The power detection circuitry of claim 10, further comprising:
- a first degeneration resistor coupled between the input transistor and the first power supply line;
- a second degeneration resistor coupled between the replica bias transistor and the first power supply line;
- a third degeneration resistor coupled between the first load transistor and the second power supply line; and
- a fourth degeneration resistor coupled between the second load transistor and the second power supply line.

13. The power detection circuitry of claim 9, further comprising:
- a bias circuit coupled to the gate terminal of the input transistor and configured to output a corresponding bias voltage to the digital-to-analog converter.

14. The power detection circuitry of claim 13, wherein the digital-to-analog converter comprises a plurality of resistors connected in a chain between a first node and a second node.

15. The power detection circuitry of claim 14, wherein the digital-to-analog converter further comprises:
- a first switch configured to selectively couple the first node of the chain to a current source; and
- a second switch configured to selectively couple the second node of the chain to the current source.

16. The power detection circuitry of claim 15, wherein the digital-to-analog converter further comprises:
- a third switch configured to selectively couple the first node of the chain to a current sink; and
- a fourth switch configured to selectively couple the second node of the chain to the current sink.

17. The power detection circuitry of claim 14, wherein the digital-to-analog converter further comprises:
- a plurality of switches selectively coupled to respective locations along the chain, wherein a selected one of the plurality of switches is activated to provide the calibration voltage to the gate terminal of the replica bias transistor.

18. Power detection circuitry comprising:
- a first squaring circuit configured to receive an alternating current (AC) signal;
- a second squaring circuit coupled to the first squaring circuit; and
- a voltage generator configured to mitigate a direct current (DC) offset of the power detection circuitry by outputting a calibration voltage to the second squaring circuit.

19. The power detection circuitry of claim 18, wherein:
- the first squaring circuit comprises an input transistor having a gate terminal configured to receive the AC signal, a first source-drain terminal coupled to a power supply line, and a second source-drain terminal coupled to a first output port of the power detection circuitry; and
- a bias transistor having a first source-drain terminal coupled to the power supply line, a second source-drain terminal coupled to a second output port of the power detection circuitry, and a gate terminal configured to receive the calibration voltage from the voltage generator.

20. The power detection circuitry of claim 18, wherein the voltage generator comprises:
- a digital-to-analog converter having a string of resistors; and
- a plurality of switches coupled to the string of resistors, wherein at least a portion of the plurality of switches are selectively activated to adjust the calibration voltage.

* * * * *